(12) United States Patent
Kwak et al.

(10) Patent No.: US 10,727,389 B2
(45) Date of Patent: Jul. 28, 2020

(54) THERMOELECTRIC GENERATING SYSTEM AND VEHICLE EXHAUST MANIFOLD HAVING THE SAME

(71) Applicant: Hyundai Motor Company, Seoul (KR)

(72) Inventors: Jin Woo Kwak, Gyeongsan-si (KR); In Woong Lyo, Suwon-si (KR); Kyong Hwa Song, Seoul (KR); Han Saem Lee, Seoul (KR); Hong Kil Baek, Seoul (KR); In Chang Chu, Seoul (KR); Gyung Bok Kim, Yongin-si (KR); Byung Wook Kim, Seongnam-si (KR); Seung Woo Lee, Seoul (KR)

(73) Assignee: Hyundai Motor Company, Seoul (KR)

( * ) Notice: Subject to any disclaimer, the term of this patent is extended or adjusted under 35 U.S.C. 154(b) by 195 days.

(21) Appl. No.: 15/209,983

(22) Filed: Jul. 14, 2016

(65) Prior Publication Data
US 2017/0288115 A1 Oct. 5, 2017

(30) Foreign Application Priority Data

Mar. 29, 2016 (KR) ........................ 10-2016-0037942

(51) Int. Cl.
*H01L 35/30* (2006.01)
*F01N 13/18* (2010.01)
(Continued)

(52) U.S. Cl.
CPC .............. *H01L 35/30* (2013.01); *F01N 5/025* (2013.01); *F01N 13/10* (2013.01); *F01N 13/18* (2013.01);
(Continued)

(58) Field of Classification Search
None
See application file for complete search history.

(56) References Cited

U.S. PATENT DOCUMENTS 9,021,795 B2 5/2015 Spieth et al.
2005/0172991 A1* 8/2005 Arai ........................ F25B 21/02
136/205

(Continued)

FOREIGN PATENT DOCUMENTS

EP 2 818 657 A1 12/2014
JP 2005-264834 A 9/2005
(Continued)

OTHER PUBLICATIONS

JP2007-165560, Machine Translation, Suzuki (Year: 2007).*
Technical Data Sheet Dupont 3500N (Year: 2013).*

*Primary Examiner* — Devina Pillay
(74) *Attorney, Agent, or Firm* — Morgan, Lewis & Bockius LLP

(57) ABSTRACT

A thermoelectric generating system may include a base substrate configured to be installed at a side of a vehicle exhaust line part; and at least one thermoelectric module configured to be installed on a top surface of the base substrate, in which a side of the exhaust line part is provided with an opening communicating with an internal space of the exhaust line part, the base substrate is installed to seal the opening of the exhaust line part, and the base substrate is made of a thermal conductive material and a surface of the base substrate is formed with an insulating layer.

7 Claims, 10 Drawing Sheets

(51) Int. Cl.
  *F01N 5/02*   (2006.01)
  *F01N 13/10*  (2010.01)
  *H01L 35/32*  (2006.01)

(52) U.S. Cl.
  CPC .......... *H01L 35/32* (2013.01); *F01N 2240/04*
    (2013.01); *F01N 2260/08* (2013.01); *Y02T*
    *10/16* (2013.01)

(56)  References Cited

U.S. PATENT DOCUMENTS

| | | |
|---|---|---|
| 2006/0053771 A1 | 3/2006 | Murata |
| 2006/0269639 A1* | 11/2006 | Bortoli ................ B05C 17/0053 425/202 |
| 2008/0060695 A1* | 3/2008 | Brignone ................ H01L 35/30 136/206 |
| 2008/0135082 A1 | 6/2008 | Hirono et al. |
| 2013/0074899 A1* | 3/2013 | Kurth ...................... H01L 35/32 136/205 |
| 2014/0150840 A1 | 6/2014 | Vitek et al. |
| 2014/0196758 A1 | 7/2014 | Kamimura et al. |
| 2014/0305481 A1* | 10/2014 | Brandenburg .......... F01N 5/025 136/205 |

FOREIGN PATENT DOCUMENTS

| | | | |
|---|---|---|---|
| JP | 2006-125321 A | 5/2006 | |
| JP | 2007-165560 A | 6/2007 | |
| JP | 2007165560 * | 6/2007 | ............ H01L 35/30 |
| JP | 2010-118475 A | 5/2010 | |
| JP | 5751261 B2 | 7/2015 | |
| KR | 10-2007-0093111 A | 9/2007 | |
| WO | WO 2004/059139 A1 | 7/2004 | |
| WO | WO 2012/123096 A1 | 9/2012 | |

\* cited by examiner

THERMOELECTRIC GENERATING SYSTEM AND VEHICLE EXHAUST MANIFOLD HAVING THE SAME

CROSS-REFERENCE TO RELATED APPLICATION

The present application is based on and claims the benefit of priority to Korean Patent Application No. 10-2016-0037942, filed on Mar. 29, 2016, the entire contents of which is incorporated herein for all purposes by this reference.

BACKGROUND OF THE INVENTION

Field of the Invention

The present invention relates to a thermoelectric generating system and a vehicle exhaust manifold having the same, and more particularly, to a thermoelectric generating system capable of greatly improving power generation efficiency by being directly supplied with heat from exhaust gas and a vehicle exhaust manifold having the same.

Description of-Related Art

As known, a thermoelectric generating system is configured to generate electricity using a thermoelectric module, in which the thermoelectric module may generate electricity using a seeback effect of generating a thermoelectromotive force by a temperature difference between both surfaces thereof.

Meanwhile, when the thermoelectric generating system intends to apply to a vehicle, to sufficiently secure the temperature difference of the thermoelectric module, one surface of the thermoelectric module may be mounted in vehicle exhaust line parts such as an exhaust pipe or a vehicle exhaust manifold and the other surface of the thermoelectric module may be provided with a cooling system.

Therefore, one surface of the thermoelectric module may form a hot side due to high heat of the exhaust gas and the other surface of the thermoelectric module may form a cold side due to cooling water of the cooling system. As such, electricity may be generated due to the temperature difference between the hot side and the cold side of the thermoelectric module.

However, a contact area between the thermoelectric module and a surface of the exhaust line part may not be sufficiently secured due to a non-flat surface of the existing exhaust line parts such as the exhaust pipe and the exhaust manifold or a shape limitation of the thermoelectric module, such that a heat loss may be severe while the heat from the exhaust gas is transferred to one surface of the thermoelectric module.

As the temperature difference between the hot side and the cold side of the thermoelectric module is not sufficiently secured due to the heat loss, the power generation efficiency of the thermoelectric module may be reduced.

The information disclosed in this Background of the Invention section is only for enhancement of understanding of the general background of the invention and should not be taken as an acknowledgement or any form of suggestion that this information forms the prior art already known to a person skilled in the art.

BRIEF SUMMARY

Various aspects of the present invention provide a thermoelectric generating system capable of greatly increasing a temperature difference between a hot side and a cold side of a thermoelectric module by minimizing a heat transfer resistance element when heat from an exhaust gas is transferred to the thermoelectric generating system, to thereby improve power generation efficiency of the thermoelectric generating system, and a vehicle exhaust manifold having the same.

According to an exemplary embodiment of the present invention, a thermoelectric generating system includes: a base substrate configured to be installed at one side of a vehicle exhaust line part; and at least one thermoelectric module configured to be installed on a top surface of the base substrate, in which one side of the exhaust line part is provided with an opening communicating with an internal space of the exhaust line part, the base substrate is installed to seal the opening of the exhaust line part, and the base substrate is made of a thermal conductive material and a surface of the base substrate is formed with an insulating layer.

The thermoelectric module may include: at least one lower electrode configured to be installed on the top surface of the base substrate; at least one upper electrode configured to be disposed at an upper portion of the lower electrode while being spaced apart from each other; and at least a pair of thermoelectric elements configured to be interposed between the lower electrode and the upper electrode and connected to the lower electrode and the upper electrode.

The base substrate may have a plurality of heat transfer fins formed on a bottom surface thereof and the plurality of heat transfer fins may be positioned within the opening of the exhaust line part.

An edge of the opening may be formed with a thick-wall portion having a thickness larger than that of a body wall of the vehicle exhaust line part and a thickness of the heat transfer fin may be formed to be smaller than that of the thick-wall portion.

The thermoelectric module may further include at least one upper substrate disposed on a top surface of the upper electrode and the upper substrate may be provided with a cooling jacket.

The base substrate may have at least one penetration portion, the lower electrode may be installed to seal the penetration portion, a bottom surface of the lower electrode may be formed with a plurality of heat transfer fins, and the plurality of heat transfer fins may penetrate through the penetration portion of the base substrate.

The thermoelectric generating system may further include: a pressure member configured to press the thermoelectric module toward the base substrate.

The thermoelectric generating system may further include: a pressure plate configured to press the pressure member.

The thermoelectric generating system may further include: a heat insulating material configured to be filled around the thermoelectric module.

According to another exemplary embodiment of the present invention, an vehicle exhaust manifold includes: a manifold body configured to have a flat surface formed on a top surface of at least a portion thereof, one side of the flat surface being formed with an opening; and a thermoelectric generating system configured to be installed on the flat surface of the manifold body, in which the thermoelectric generating system includes a base substrate installed to seal the opening of the manifold body and at least one thermoelectric module installed on a top surface of the base substrate.

The base substrate may be made of a thermal conductive material and a surface of the base substrate may be formed with an insulating layer.

The thermoelectric module may include: at least one lower electrode configured to be installed on the top surface of the base substrate; at least one upper electrode configured to be disposed at an upper portion of the lower electrode while being spaced apart from each other; and at least a pair of thermoelectric elements configured to be interposed between the lower electrode and the upper electrode and connected to the lower electrode and the upper electrode.

The base substrate may have a plurality of heat transfer fins formed on a bottom surface thereof and the plurality of heat transfer fins may be positioned within the opening of the exhaust line part.

An edge of the opening may be formed with a thick-wall portion having a thickness larger than that of a body wall of the vehicle exhaust line part and a thickness of the heat transfer fin may be formed to be smaller than that of the thick-wall portion.

The thermoelectric module may further include at least one upper substrate disposed on a top surface of the upper electrode and the upper substrate may be provided with a cooling jacket.

The base substrate may have at least one penetration portion, the lower electrode may be installed to seal the penetration portion, a bottom surface of the lower electrode may be formed with a plurality of heat transfer fins, and the plurality of heat transfer fins may penetrate through the penetration portion of the base substrate.

The methods and apparatuses of the present invention have other features and advantages which will be apparent from or are set forth in more detail in the accompanying drawings, which are incorporated herein, and the following Detailed Description, which together serve to explain certain principles of the present invention.

BRIEF DESCRIPTION OF THE DRAWINGS

FIG. 9 is a diagram illustrating a state in which the lower electrode of the thermoelectric generating system according to another exemplary embodiment of the present invention is coupled with the base substrate by welding, or the like; and FIG. 10 is a diagram illustrating a state in which the lower electrode of the thermoelectric generating system according to another exemplary embodiment of the present invention is coupled with the base substrate by a fastener, or the like.

Figure 1:
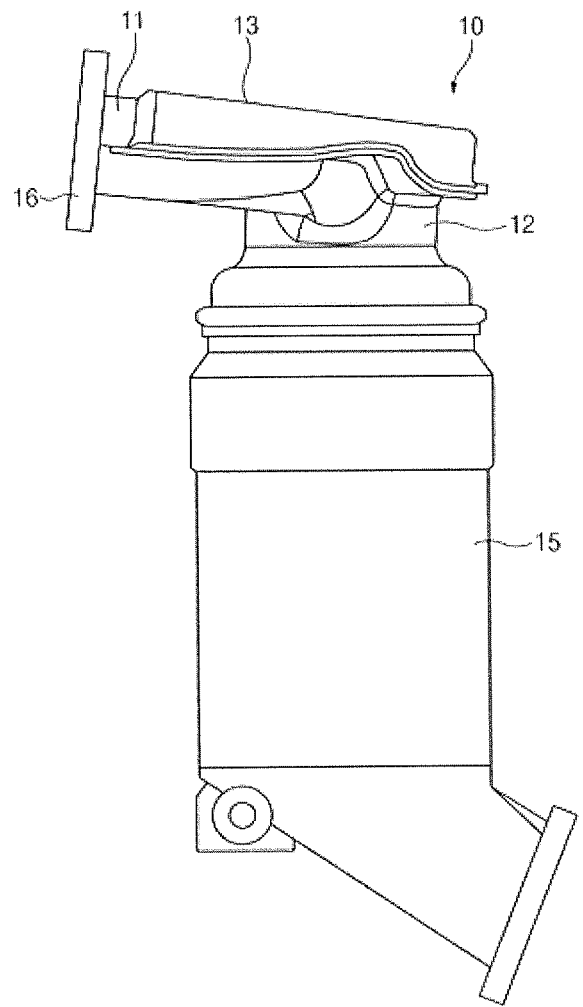
FIG. 1 is a perspective view illustrating a vehicle exhaust manifold according to an exemplary embodiment of the present invention and a catalyst converter connected thereto.

It should be understood that the appended drawings are not necessarily to scale, presenting a somewhat simplified representation of various features illustrative of the basic principles of the invention. The specific design features of the present invention as disclosed herein, including, for example, specific dimensions, orientations, locations, and shapes will be determined in part by the particular intended application and use environment.

In the figures, reference numbers refer to the same or equivalent parts of the present invention throughout the several figures of the drawing.

DETAILED DESCRIPTION

Reference will now be made in detail to various embodiments of the present invention(s), examples of which are illustrated in the accompanying drawings and described below. While the invention(s) will be described in conjunction with exemplary embodiments, it will be understood that the present description is not intended to limit the invention(s) to those exemplary embodiments. On the contrary, the invention(s) is/are intended to cover not only the exemplary embodiments, but also various alternatives, modifications, equivalents and other embodiments, which may be included within the spirit and scope of the invention as defined by the appended claims.

Figure 2:
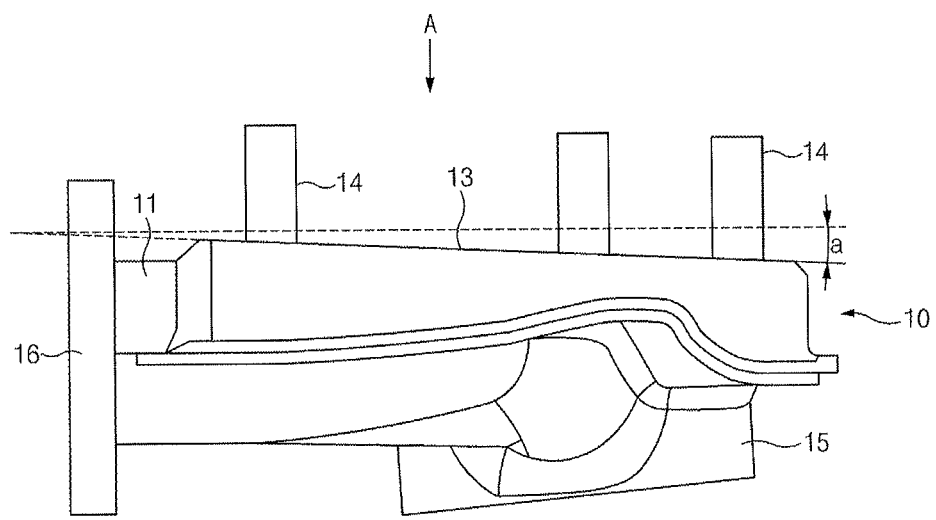
FIG. 2 is a side view illustrating the vehicle exhaust manifold according to the exemplary embodiment of the present invention.
Figure 3:
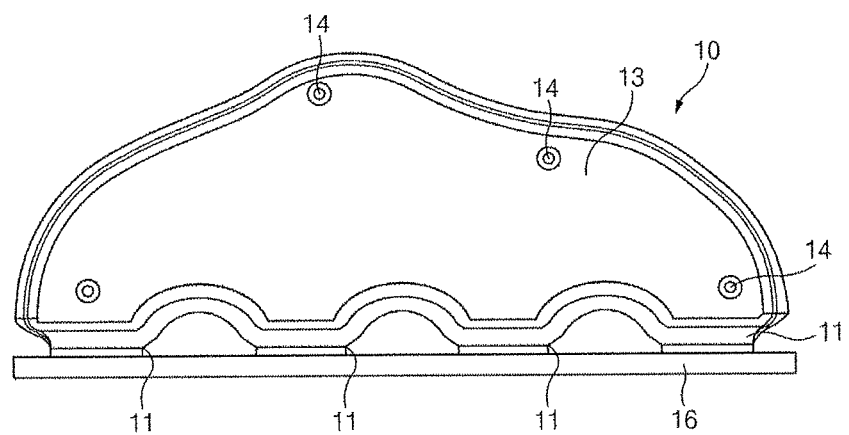
FIG. 3 is a plan view viewed from arrow direction A of FIG. 2.

Referring to FIGS. 1 to 3, a vehicle exhaust manifold according to various exemplary embodiments of the present invention may include a manifold body 10.

One side of the manifold body 10 is provided with a plurality of inlet portions 11 extending outwardly, in which the plurality of inlet portions 11 may be coupled with an engine side to introduce exhaust gas generated from the engine into the manifold body 10 through the plurality of inlet portions 11.

The plurality of inlet portions 11 may be coupled with an inlet flange 16, in which the inlet flange 16 may have a plurality of openings communicating with the plurality of inlet portions 11.

The other side of the manifold body 10 may be provided with an outlet portion 12, in which the outlet portion 12 may be connected to a catalyst converter 15 or an exhaust pipe, or the like.

An inside of the manifold body 10 may be formed with a space in which the exhaust gas introduced through the plurality of inlet portions 11 is collected.

The manifold body 10 may have a flat surface 13 formed on at least one surface thereof. FIGS. 1 to 3 illustrate that the flat surface 13 is formed on a top surface of the manifold body 10.

As the flat surface 13 is formed on at least one surface of the manifold body 10, a volume of the manifold body 10 may be formed to be larger than those of each inlet portion 11 and thus a cross sectional area of the manifold body 10 may be formed to be larger than those of inlet portions to reduce a back pressure, thereby greatly improving flowabilty of the exhaust gas.

Further, as illustrated in FIG. 2, the flat surface 13 may be inclinedly disposed at a predetermined angle a from a horizontal surface, such that a flow of the exhaust gas may be more smoothly implemented.

Further, the flat surface 13 of the manifold body 10 may be provided with a plurality of studs 14 protruding upwardly. The stud 14 may be fixed to the flat surface 13 of the manifold body 10 by welding, or the like.

Figure 4:
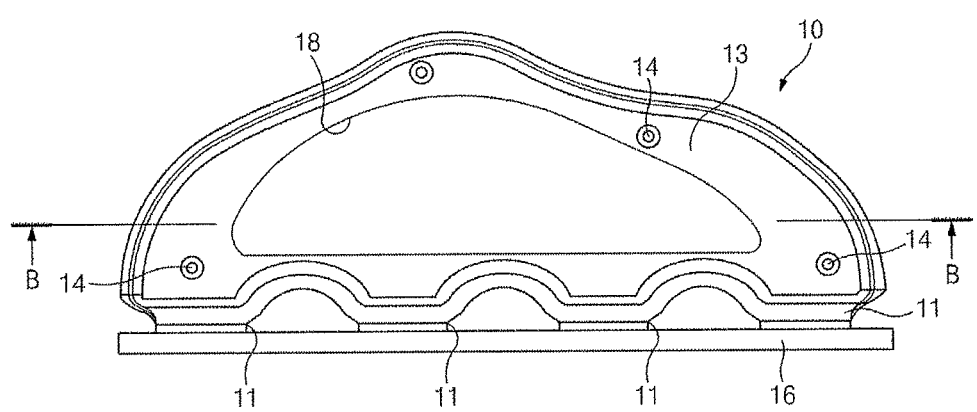
FIG. 4 is a diagram illustrating a state in which a flat surface of a manifold body of FIG. 3 is formed with an opening.

Referring to FIG. 4, the flat surface 13 of the manifold body 10 may be formed with an opening 18 which communicates with the internal space of the manifold body 10 and a thermoelectric generating system may be very firmly and stably installed on the flat surface 13. Further, a hot side of the thermoelectric generating system may be installed at the opening 18 to directly transfer the heat from the exhaust gas to the thermoelectric generating system, such that a temperature difference between the hot side and a cold side of the thermoelectric generating system may be greatly increased, thereby greatly improving power generation efficiency.

Figure 5:
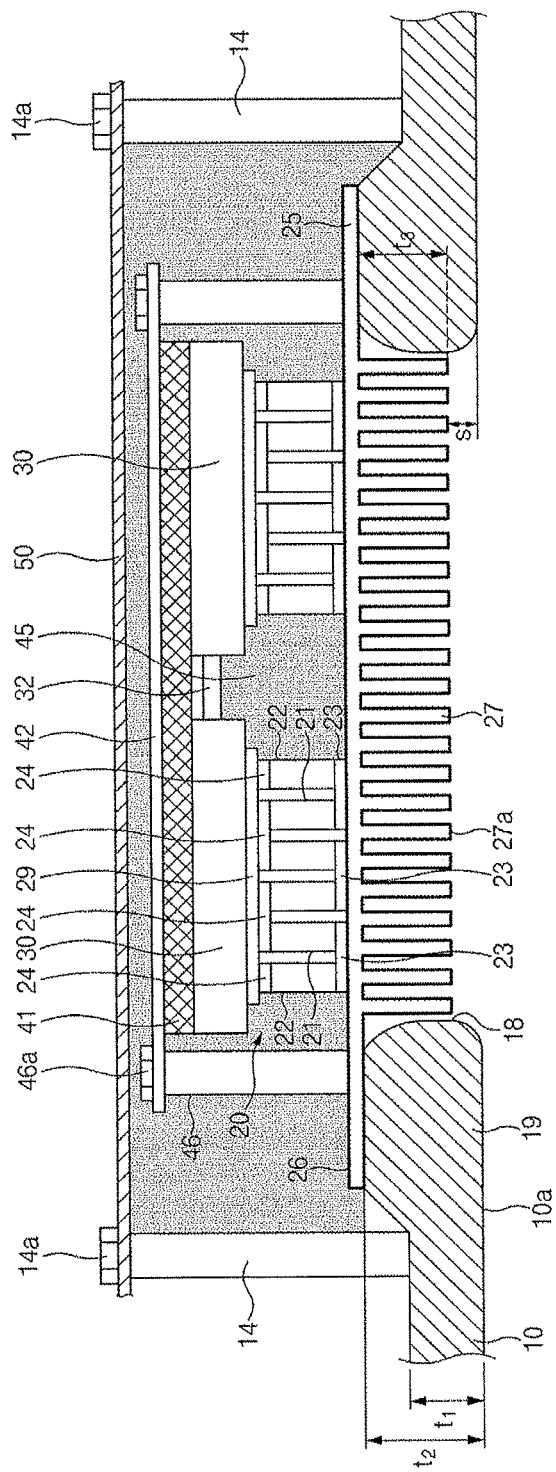
FIG. 5 is a cross-sectional view taken along line B-B of FIG. 4 and is a cross-sectional view illustrating a state in which a thermoelectric generating system according to an exemplary embodiment of the present invention is installed at an opening of the manifold body.

Referring to FIG. 5, the thermoelectric generating system according to various exemplary embodiments of the present invention may include a base substrate 25 and at least one thermoelectric module 20 installed on a top surface of the base substrate 25.

The base substrate 25 may be made of thermal conductive materials such as copper and stainless and an insulating layer 26 may be formed on a surface of the base substrate 25.

As illustrated in FIG. 5, the base substrate 25 may be installed on the flat surface 13 of the manifold body 10 of the exhaust manifold, such that a bottom surface of the base substrate 25 may directly contact the opening 18 of the flat surface 13. Since the base substrate 25 directly contacts the opening 18, the heat from the exhaust gas passing through the internal space of the manifold body 10 may be directly transferred to the base substrate 25. By doing so, a heat loss caused when the heat from the exhaust gas is transferred to the thermoelectric generating system may be minimized to increase the temperature difference between the hot side and the cold side of the thermoelectric generating system, thereby greatly improving the power generation efficiency.

Meanwhile, the thermoelectric generating system according to various exemplary embodiments of the present invention may also be installed in various kinds of exhaust line parts through which the exhaust gas passes, such as the exhaust manifold having the flat surface 13 of FIGS. 1 to 4 and the exhaust pipe. In summary, the thermoelectric generating system according to various exemplary embodiments of the present invention may also be installed in various kinds of exhaust line parts through which the exhaust gas passes, such as the exhaust manifold having the flat surface formed on at least one surface thereof and the exhaust pipe.

The base substrate 25 is configured at a size which may cover an edge of the opening 18, such that an edge of the bottom surface of the base substrate 25 may be hermetically installed at the edge of the opening 18 by welding, or the like. Therefore, it is possible to certainly prevent the exhaust gas from being leaked to the outside through the opening 18.

Further, the bottom surface of the base substrate 25 is provided with a plurality of heat transfer fins 27 and the plurality of heat transfer fins 27 are disposed within the opening 18, such that the heat from the exhaust gas may be directly transferred to the base substrate 25 through the plurality of heat transfer fins 27 and a heat transfer rate may be greatly increased by the heat transfer fins 27.

Meanwhile, the edge of the opening 18 may be formed with a thick-wall portion 19 larger than a thickness t1 of a body wall of the manifold body 10.

A thickness t3 of the heat transfer fin 2 may be formed to be smaller than a thickness t2 of the thick-wall portion 19, such that a lower end 27a of the heat transfer fin 27 may be recessed from an inner surface 10a of the manifold body 10. By doing so, the heat transfer fin 27 may not be drawn in the internal space of the manifold body 10, such that the heat transfer fin 27 may not affect the back pressure of the exhaust gas.

Further, each of the heat transfer fins 27 may extend in parallel with a flow direction of the exhaust gas, such that the influence on the back pressure of the exhaust gas may be minimized.

The thermoelectric module 20 may include at least one lower electrode 23 installed on the top surface of the base substrate 25, at least one upper electrode 24 disposed at an upper portion of the lower electrode 23 to be spaced apart from each other, and at least a pair of thermoelectric elements 21 and 22 interposed between the lower electrode 23 and the upper electrode 24.

The lower electrode 23 may be installed on the top surface of the base substrate 25, in particular, may be fixed on an insulating layer 26 of the base substrate 25 by an adhesive, or the like.

The upper electrodes 24 may be disposed at an opposite side of the lower electrodes 23, that is, the upper portion while being spaced apart from each other. In particular, the upper electrodes 24 and the lower electrodes 23 may be arranged in a zigzag structure.

The pair of thermoelectric elements 21 and 22 may have opposite polarity to each other, like a P-type semiconductor element, an N-type semiconductor element, or the like.

Further, an upper substrate 29 may be installed on a top surface of the upper electrode 24 and a cooling jacket 30 having a cooling passage through which a cooling medium passes may also be installed on a top surface of the upper substrate 29.

As illustrated in FIG. 5, when the plurality of thermoelectric modules 20 are installed and thus the plurality of cooling jackets 30 are installed corresponding to each of the thermoelectric modules 20, a connector 32 may be installed between the plurality of cooling jackets 30 and the connector 32 may have a connecting passage through which a flow of the cooling medium is connected between the adjacent cooling jackets 30.

By this configuration, in the thermoelectric generating system according to various exemplary embodiments of the present invention, the base substrate 25 to which the heat from the exhaust gas is directly transferred may be configured as the hot side and the upper substrate 29 to which cooling air is transferred from the cooling jacket 30 may be configured as the cold side. As a result, the thermoelectric generating system may perform the thermoelectric power generation using the temperature difference between the hot side and the cold side.

Further, as illustrated in FIG. 5, the thermoelectric generating system according to various exemplary embodiments of the present invention may further include a pressure member 41 which presses the thermoelectric module 20 toward the base substrate 25.

According to the exemplary embodiment of the present invention, the pressure member 41 may be configured as a pressure mat which is installed at an upper portion of the cooling jacket 30. The pressure mat may have a complex structure of a ceramic fiber and a layered silicate material to have a predetermined compression rate. A contact pressure may be controlled depending on the compression rate of the pressure mat 31 to secure appropriate pressure performance for the thermoelectric module 20.

The thermoelectric module 20 and the cooling jacket 30 may be more firmly installed to the exhaust line parts such as the manifold body 10 and the exhaust pipe by the pressure member 41, thereby effectively preventing the thermoelectric module 20 from being damaged due to vibration, or the like. Further, the thermoelectric module 20 adheres to the flat surface 13 of the exhaust line parts such as the manifold body 10 and the exhaust pipe by the pressure member 41, thereby maintaining the firm mountability of the cooling jacket 30 and the thermoelectric module 20.

According to another exemplary embodiment of the present invention, the pressure member 41 may be formed of a metal mesh having shock-absorbing nature and pressurization, the metal mesh may have a predetermined compression rate similar to that of the foregoing pressure mat, and the contact pressure may be controlled depending on the compression rate of the metal mesh to secure appropriate pressure performance for the thermoelectric module 20.

Further, the metal mesh includes the shock-absorbing nature to perform an appropriate shock-absorbing function on the thermal expansion of the thermoelectric module 20, thereby more effectively preventing the thermoelectric module 20 from being damaged.

Further, a heat protect cover 50 may be installed at the upper portion of the exhaust line parts such as the manifold body 10 and the exhaust pipe through the stud 14. The heat protect cover 50 may be configured to cover the upper portion and the side surface of the thermoelectric generating system.

As a fastener 14a such as nut is fastened with an upper end of the stud 14, the heat protect cover 50 may be installed to cover the upper portion of the exhaust line parts such as the manifold body 10 and the exhaust pipe. As the heat protect cover 50 covers the upper portion of the exhaust line parts such as the manifold body 10 and the exhaust pipe, the heat from the exhaust gas may be prevented from being lost to the outside and the thermoelectric module 20, or the like may be stably protected from external physical effects.

A pressure plate 42 pressing the pressure member 41 may be installed at the upper portion of the pressure member 41 and the pressure plate 42 may be installed through an auxiliary stud 46.

As the pressure plate 42 is seated at the upper end of the auxiliary stud 46 and then a fastener 46a such as the nut is fastened with a screw portion of the upper end of the auxiliary stud 46, the pressure plate 42 may be installed on a top surface of the pressure member 41.

Further, the surrounding of the thermoelectric module 20 may be densely filled with a heat insulating material 45 such as glass wool, such that it is possible to prevent various kinds of parts of the thermoelectric module 20 from being separated to the outside and effectively prevent the heat from being lost to the outside, thereby sufficiently securing the temperature difference between the cold side and the hot side of the thermoelectric module 20.

Further, the heat insulating material 45 may be filled to enclose the thermoelectric module 20, the cooling jacket 30, the pressure mat 41, the pressure plate 42, or the like within the heat protect cover 50 as well as around the thermoelectric module 20.

FIGS. 6 to 10 are diagrams illustrating a thermoelectric generating system according to another exemplary embodiment of the present invention.

Figure 6:
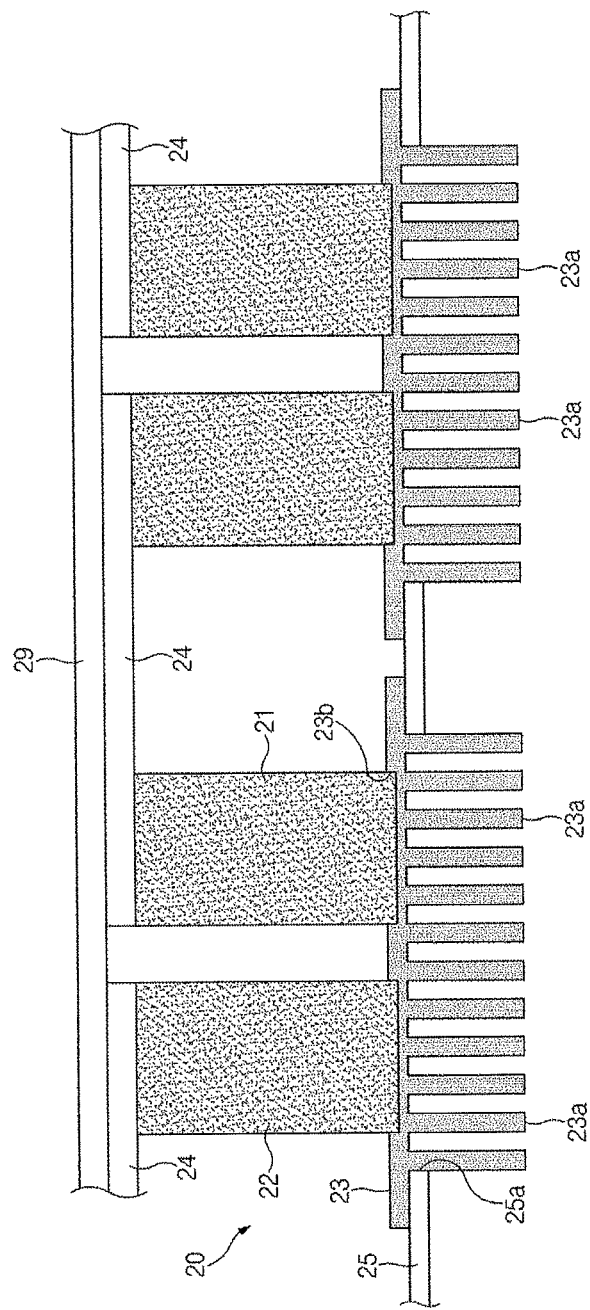
FIG. 6 is a cross-sectional view illustrating a coupling structure of a lower electrode of a thermoelectric generating system according to another exemplary embodiment of the present invention with a base substrate.

Referring to FIG. 6, in the thermoelectric generating system according to another exemplary embodiment of the present invention, a plurality of heat transfer fins 23a are formed on a bottom surface of the lower electrode 23 and the heat transfer fin 23a of the lower electrode 23 is installed to penetrate through the base substrate 25, such that the lower electrode 23 may be configured to directly receive the heat from the exhaust gas, thereby more increasing the heat transfer rate of the exhaust gas.

Figure 7:
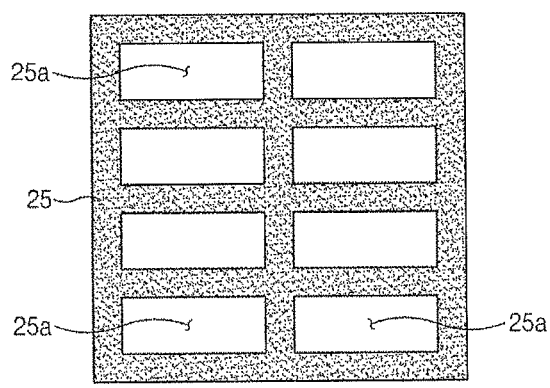
FIG. 7 is a plan view of the base substrate of FIG. 6 viewed from the top.

As illustrated in FIGS. 6 and 7, the base substrate 25 has a plurality of penetration portions 25a, in which the heat transfer fins 23a of the lower electrode 23 are installed to penetrate through each of the penetration portions 25a and the lower electrode 23 may be installed to seal the penetration portion 25a.

A plurality of groove portions 23b into which lower ends of each of the thermoelectric elements 21 and 22 are inserted may be provided on the top surface of the lower electrode 23. Therefore, the assembling performance and the mountability of the thermoelectric elements 21 and 22 may be improved.

Figure 9:
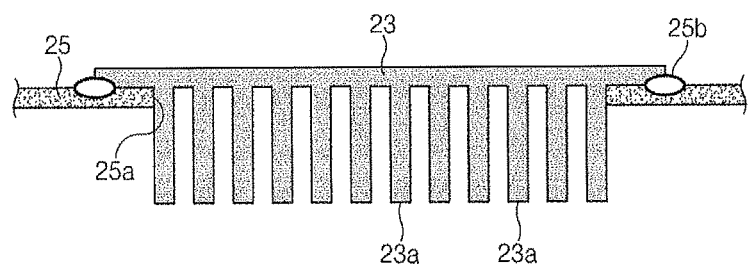

Meanwhile, as illustrated in FIG. 9, the edge of the lower electrode 23 may be coupled with an edge of the penetration portion 25a of the base substrate 25 by blazing, soldering, welding 25b, or the like.

Figure 10:
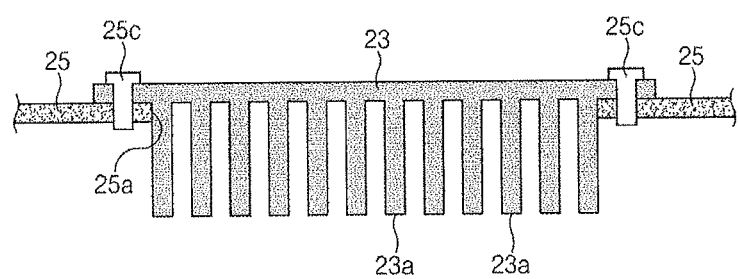

Unlike this, as illustrated in FIG. 10, the edge of the lower electrode 23 may also be coupled with the edge of the penetration portion 25a of the base substrate 25 by a fastener 25c such as a bolt and a rivet.

Figure 8:
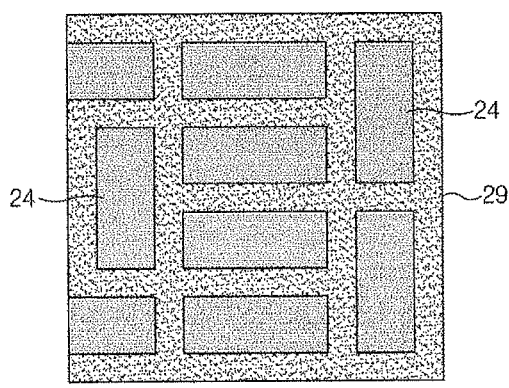
FIG. 8 is a bottom view of an upper substrate of FIG. 6 viewed from the bottom.

Further, as illustrated in FIG. 8, the plurality of upper electrodes 24 are attached to the bottom surface of the upper substrate 29.

As described above, according to the exemplary embodiments of the present invention, the temperature difference between the hot side and the cold side of the thermoelectric generating system may be greatly increased by directly transferring the heat from the exhaust gas to the thermoelectric generating system mounted in the exhaust line parts such as the exhaust manifold and the exhaust pipe, thereby greatly improving the power generation efficiency.

For convenience in explanation and accurate definition in the appended claims, the terms "upper", "lower", "inner", "outer", "up", "down", "upper", "lower", "upwards", "downwards", "front", "rear", "back", "inside", "outside", "inwardly", "outwardly", "interior", "exterior", "inner", "outer", "forwards", and "backwards" are used to describe features of the exemplary embodiments with reference to the positions of such features as displayed in the figures.

The foregoing descriptions of specific exemplary embodiments of the present invention have been presented for purposes of illustration and description. They are not intended to be exhaustive or to limit the invention to the precise foul's disclosed, and obviously many modifications and variations are possible in light of the above teachings. The exemplary embodiments were chosen and described in order to explain certain principles of the invention and their practical application, to thereby enable others skilled in the art to make and utilize various exemplary embodiments of the present invention, as well as various alternatives and modifications thereof. It is intended that the scope of the invention be defined by the Claims appended hereto and their equivalents.

What is claimed is:

1. A thermoelectric generating system, comprising:
   a base substrate being installed at a side of an exhaust line part; and
   at least one thermoelectric module being installed on a top surface of the base substrate, wherein the exhaust line part is formed with an opening communicating with an internal space of the exhaust line part and a body wall formed with the opening, wherein the base substrate is installed to seal the opening of the exhaust line part, and wherein the base substrate is made of a thermal conductive material and a surface of the base substrate is formed with an insulating layer, wherein the base substrate is provided with a plurality of heat transfer fins and the plurality of heat transfer fins are positioned within the opening of the exhaust line part, and wherein an edge of the opening is formed with a thick-wall portion having a thickness larger than that of the body wall of the exhaust line part, wherein each of the plurality of heat transfer fins has a first end directed toward the internal space of the exhaust line part and a second end directed toward an external space of the exhaust line part, wherein the first end is disposed between an inner surface of the body wall and an outer surface of the body wall inside the opening in a state that the first end is recessed from the inner surface of the body wall toward the outer surface of the exhaust line part inside the opening, wherein the inner surface of the body wall faces the internal space of the exhaust line part and the outer surface of the body wall faces the external space of the exhaust line part, and wherein the inner surface of the body wall, the first end of each of the plurality of heat transfer fins, and the outer surface of the body wall are aligned in series from a center portion of the exhaust line part in a radial direction of the exhaust line part.

2. The thermoelectric generating system according to claim 1, wherein the at least one thermoelectric module includes:

at least one lower electrode being installed on the top surface of the base substrate;

at least one upper electrode being disposed at an upper portion of the at least one lower electrode while being spaced apart from each other; and at least a pair of thermoelectric elements being interposed between the at least one lower electrode and the at least one upper electrode and connected to the at least one lower electrode and the at least one upper electrode.

3. The thermoelectric generating system according to claim 2, wherein the at least one thermoelectric module further includes at least one upper substrate disposed on a top surface of the at least one upper electrode and the at least one upper substrate is provided with a cooling jacket.

4. The thermoelectric generating system according to claim 2, wherein the base substrate has at least one penetration portion, the at least one lower electrode is installed to seal the at least one penetration portion, a bottom surface of the at least one lower electrode is formed with the plurality of heat transfer fins, and the plurality of heat transfer fins penetrate through the at least one penetration portion of the base substrate.

5. The thermoelectric generating system according to claim 2, further comprising a pressure member pressing the at least one thermoelectric module toward the base substrate.

6. The thermoelectric generating system according to claim 5, further comprising a pressure plate pressing the pressure member.

7. The thermoelectric generating system according to claim 2, further comprising:

a heat insulating material being filled around the at least one thermoelectric module.

* * * * *